(12) United States Patent
Funk

(10) Patent No.: US 7,576,018 B2
(45) Date of Patent: Aug. 18, 2009

(54) METHOD FOR FLEXING A SUBSTRATE DURING PROCESSING

(75) Inventor: Merritt Funk, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 114 days.

(21) Appl. No.: 11/684,957

(22) Filed: Mar. 12, 2007

(65) Prior Publication Data
US 2008/0224364 A1    Sep. 18, 2008

(51) Int. Cl.
H01L 21/00 (2006.01)
(52) U.S. Cl. .................. 438/800; 438/905; 438/935
(58) Field of Classification Search ............. 427/248.1; 134/22.1; 438/800, 905, 935
See application file for complete search history.

(56) References Cited

U.S. PATENT DOCUMENTS

| | | | |
|---|---|---|---|
| 5,094,885 A | * | 3/1992 | Selbrede .................. 427/248.1 |
| 6,318,384 B1 | * | 11/2001 | Khan et al. ................ 134/22.1 |
| 6,492,612 B1 | | 12/2002 | Taguchi et al. |

FOREIGN PATENT DOCUMENTS

WO    02/086957 A1    10/2002

\* cited by examiner

Primary Examiner—Leonardo Andújar
Assistant Examiner—Monica D Harrison
(74) Attorney, Agent, or Firm—Wood, Herron & Evans, L.L.P.

(57) ABSTRACT

A method is provided to cause deformation of a substrate during processing of the substrate. The method comprises supporting a substrate on a substrate support in a vacuum chamber for processing; providing backside gas through inlet ports of each of a plurality of groups of ports lying in a respective plurality of areas across the substrate support to a space between the substrate support and the substrate, each of said areas of the substrate support having at least one backside gas inlet port connected to a supply of backside gas and at least one outlet port connected to a vacuum exhaust system; and separately controlling the pressure of the backside gas at different ones of the ports of the plurality to control separately, in areas around the respective ones of said ports, the local pressure force exerted on the backside of the substrate, by separately dynamically controlling at least one valve affecting gas flow to a port of each of said areas while separately dynamically controlling at least one other valve affecting gas flow from the remaining plurality of ports of each of said areas surrounding said port to which gas is introduced.

20 Claims, 6 Drawing Sheets

METHOD FOR FLEXING A SUBSTRATE DURING PROCESSING

This application is related to U.S. patent application Ser. No. 11/684,853 entitled "Dynamic Control Of Process Chemistry For Improved Within Substrate Process Uniformity", filed on even date herewith, and U.S. patent application Ser. No. 11/684,818 entitled "Dynamic Temperature Backside Gas Control For Improved Within-Substrate Process Uniformity", filed on even date herewith; and hereby expressly incorporated by reference herein.

FIELD OF THE INVENTION

This invention relates to the deformation of a substrate during the processing of the substrate. The invention particularly relates to locally flexing a substrate by dynamic adjustment of the gas pressure on the backside of the substrate.

BACKGROUND OF THE INVENTION

In semiconductor manufacturing, the complexity of devices formed on semiconductor substrates continues to increase at a rapid pace, while the size of features, such as transistor gates, continues to decrease well below the 93 nanometer (nm) technology node. As a result, manufacturing processes require increasingly sophisticated unit process and process integration schemes, as well as process and hardware control strategies to ensure the uniform fabrication of devices across the substrate. For example, during the fabrication of a gate electrode structure in a transistor device, patterning systems and etching systems, which facilitate the formation of the gate structure in a plurality of material films formed on the substrate, are required to achieve and preserve the gate structure critical dimension (CD) vertically within high-aspect-ratio devices. Furthermore, for example, during the deposition of thin conformal films over complex topography, depositions systems are required to deposit thin films of uniform thickness over both flat surfaces, such as the flat-field and the bottoms of structures, but also along the side-walls of high-aspect-ratio structures.

SUMMARY OF THE INVENTION

A general objective of the present invention is to cause deformation of a substrate during the processing of the substrate.

A more particular objective of the invention is to provide local flexing of a substrate by dynamic adjustment of the gas pressure on the backside of the substrate.

According to certain embodiments of the present invention, a method is provided to cause deformation of a substrate during processing of the substrate. The method comprises supporting a substrate on a substrate support in a vacuum chamber for processing; providing backside gas through inlet ports of each of a plurality of groups of ports lying in a respective plurality of areas across the substrate support to a space between the substrate support and the substrate, each of said areas of the substrate support having at least one backside gas inlet port connected to a supply of backside gas and at least one outlet port connected to a vacuum exhaust system; and separately controlling the pressure of the backside gas at different ones of the ports of the plurality to control separately, in areas around the respective ones of said ports, the local pressure force exerted on the backside of the substrate.

Control of the pressure may include separately dynamically controlling at least one valve affecting gas flow to a port of each of said areas while separately dynamically controlling at least one other valve affecting gas flow from the remaining plurality of ports of each of said areas surrounding said port to which gas is introduced.

According to other embodiments of the invention, a method of locally deforming a substrate is provided in which a deformation profile for a substrate during processing is determined. The substrate is supported on a substrate support in a vacuum chamber for processing, and backside is provided gas through each of a plurality of groups of inlet ports lying in a respective plurality of areas across the substrate support to a space between the substrate support and the substrate. Each of said areas of the substrate support has at least one backside gas inlet port connected to a supply of backside gas and at least one outlet port connected to a vacuum exhaust system. During processing, the pressure of the backside gas is separately controlled at different ones of the ports of the plurality to control separately, in areas around the respective ones of said ports, the local pressure force exerted on the backside of the substrate, to achieve the predetermined deformation profile of the substrate.

In certain embodiments of the invention, the pressure profile is predetermining to produce the predetermined deformation profile and the pressure of the backside gas is separately controlled in accordance with the predetermined pressure profile. In other embodiments, deformation of the substrate is sensed during processing; and the pressure of the backside gas is separately controlled in response to the sensed deformation of the substrate.

DETAILED DESCRIPTION

In the following description, for purposes of explanation and not limitation, specific details are set forth, such as a particular geometry of the substrate processing system and descriptions of various processes. However, it should be understood that the invention may be practiced in other embodiments that depart from these specific details.

The substrate processing system can comprise a plasma processing system configured to treat a substrate with plasma. Alternatively, the substrate processing system can comprise a non-plasma processing system configured to treat a substrate. The substrate processing system may comprise an etching system that utilizes plasma to facilitate a dry etching process during semiconductor manufacturing. Examples of an etching system are provided in U.S. Pat. No. 6,492,612 and PCT Publication WO 02/086957; each of which are hereby expressly incorporated herein by reference. Nonetheless, the invention can be used for improving uniformity in deposition systems or in other processing systems.

For example, the substrate processing system may include a thermal treatment module in a photoresist coating system such as a track system; a vapor deposition system such as a chemical vapor deposition (CVD) system, a plasma enhanced CVD (PECVD) system, an atomic layer deposition (ALD) system, a plasma enhanced ALD (PEALD) system, a physical vapor deposition (PVD) system or an ionized PVD (iPVD) system; a dry plasma etching system; a dry non-plasma etching system; a dry cleaning system; an ashing system; a chemical oxide removal (COR) system; or a single substrate thermal processing system configured to thermally treat a substrate.

The substrate processing system may be configured to process a substrate of arbitrary shape. A typical substrate may be a circular wafer of various diameters including, but not limited 200 millimeters (mm), 300 mm, 450 mm, or larger. Additionally, for example, the substrate may be a semiconductor substrate, such as a silicon substrate or SiGe substrate, or a silicon-on-insulator (SOI) substrate. Alternatively, for example, the substrate may have a rectangular shape, such as a flat panel or liquid crystal display (LCD).

Figure 1:
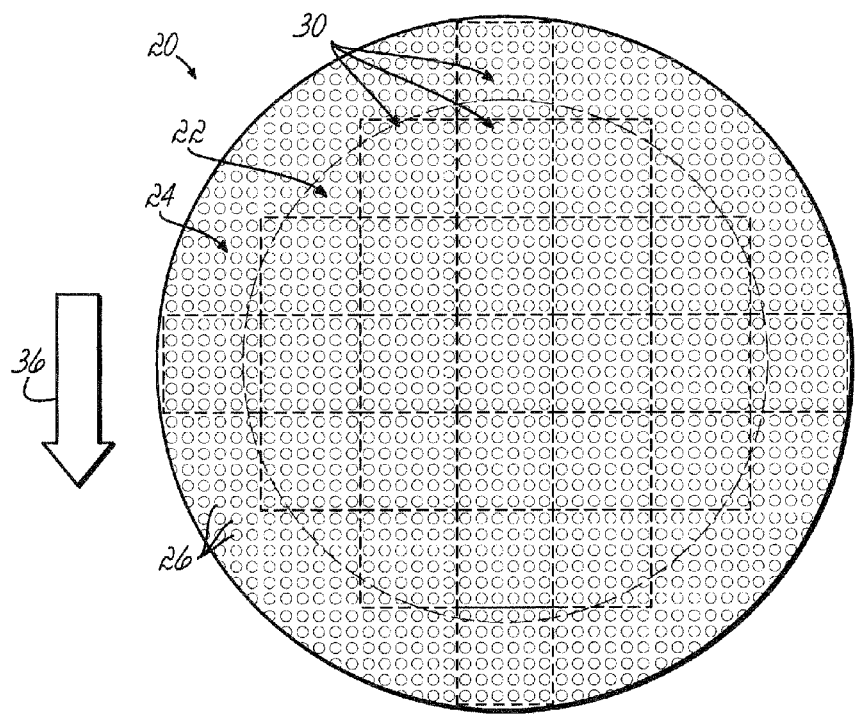
FIG. 1 is a diagram of an upper surface of a substrate supporting chuck sub-divided into multiple controlled backside gas zones according to one embodiment of the invention.

In the drawings, where like reference numerals designate identical or corresponding parts throughout the several views, FIG. 1 is a plan view of the face of a substrate support table 20 for supporting a substrate for processing in the process chamber of a substrate processing module, for example, the etch module referred to above. The table 20 comprises a substrate clamping system (e.g., electrical or mechanical clamping system) to clamp the substrate to the upper surface of table 20. For example, table 20 may include an electrostatic chuck (ESC). The clamping system provides a clamping force that is sufficiently great to overcome the opposing pressure force resulting from the supply of heat transfer gas to the backside of the substrate. Furthermore, the clamping force may be adjustable to affect an increase or decrease in substrate contact with the table 20. The design and implementation of a substrate clamping system is well known to those skilled in the art of semiconductor manufacturing equipment and of mechanical and electrostatic clamping systems.

The table 20 comprises a table temperature control system having one or more temperature control elements. The table temperature control system can include a heating system, or a cooling system, or both. For example, table 20 can include a substrate heating element or substrate cooling element (not shown) beneath the surface of the table 20. For instance, the heating system or cooling system can include a re-circulating fluid flow that receives heat from table 20 and transfers heat to a heat exchanger system (not shown) when cooling, or transfers heat from the heat exchanger system to the table when heating. The cooling system or heating system may include heating/cooling elements, such as resistive heating elements, or thermoelectric heaters/coolers located within table 20. Additionally, the heating elements or cooling elements or both can be arranged in more than one separately controlled temperature zone. As illustrated in FIG. 1, the support table 20 may have two thermal zones, including an inner circular zone 22 and an outer annular zone 24. The temperatures of the zones 22 and 24 may be controlled by heating or cooling the support table thermal zones separately.

The upper surface of the table 20 may be provided with an array of gas ports 26 through which a heat transfer gas, such as helium, can be introduced to, or removed from, the space between the backside of the substrate and the upper surface of the table 20. The introduction of heat transfer gas to the backside of the substrate facilitates an increase in the thermal conduction between the substrate and table 20, while removal of heat transfer gas from the backside of the substrate facilitates a decrease in the thermal conduction between the substrate and table 20. In an etch system, the typical pressure of the heat transfer gas may be approximately 30 Torr, typically exceeding the processing pressure in the vacuum processing chamber and, hence, this difference in pressure results in a net force on the substrate outward from the surface of the support table 20. As described above, this pressure force is overcome by a clamping system, for example, by an electrostatic chuck that provides an electrostatic clamping force to hold the substrate to the table 20. In conventional systems, the introduction of heat transfer gas is typically maintained in a static condition between the substrate and the support surface of the table 20.

According to the embodiment illustrated in FIG. 1, the gas ports 26 are arranged and grouped into zones or areas. For example, the groups of ports 26 may be arranged in a Cartesian, or grid-like, manner. As an example of such a case, a rectangular array of twenty-five square zones 30 is depicted. However, the shape of each zone or number of zones or both can be arbitrary. For instance, each zone can correspond to a substrate die.

Figure 3:
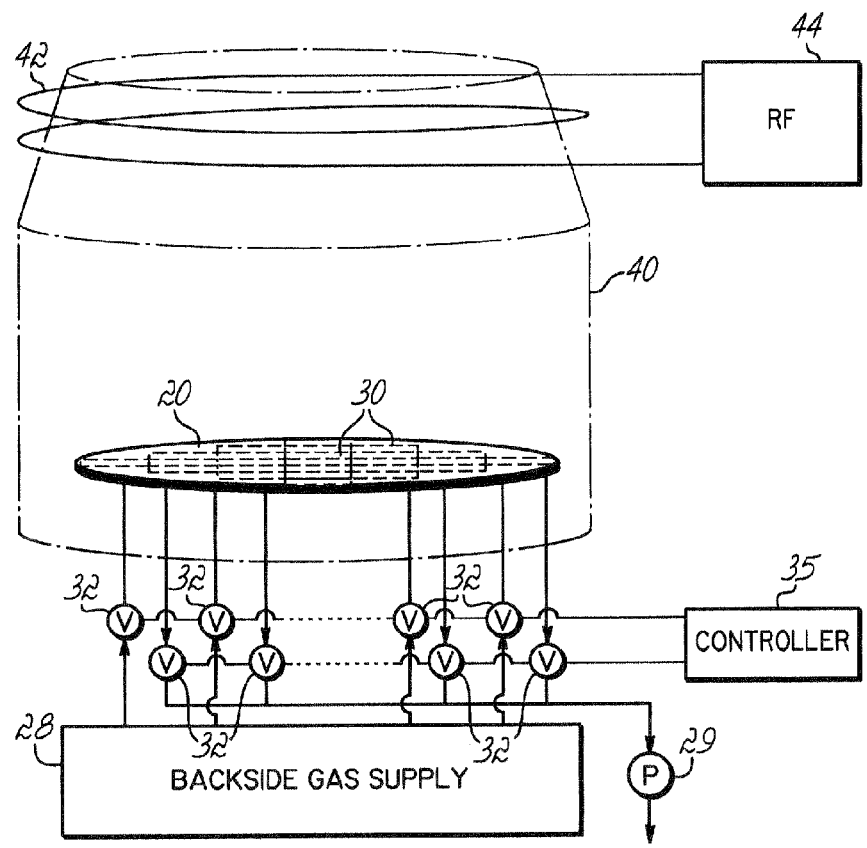
FIG. 3 is a simplified diagram of a plasma processing system having a substrate supporting chuck.

Each of the zones 30 includes at least one gas port through which heat transfer gas can be introduced or through which heat transfer gas can be removed. For instance, as shown in FIG. 1, each zone may have a set of thirty-six gas ports 26. At least some fraction of these gas ports 26 may be coupled to a gas supply source 28 through a zone control valve 32, as illustrated in FIG. 3. At least some fraction of these gas ports 26 within a zone 30 may be coupled to an exhaust or pumping system 29 through another control valve 32. Gas ports for supplying heat transfer gas can be independent from gas ports for removing heat transfer gas, as depicted in FIG. 3. Alternatively, gas ports for supplying heat transfer gas may also be utilized for removing heat transfer gas. In such a case, at least two control valves may be utilized for each zone to alternatively either valve off flow to the exhaust and permit a flow of heat transfer gas to the substrate or valve off the flow from the gas supply source and permit flow from the substrate to the exhaust.

Gas ports 26 corresponding to a specific zone 30 that are configured to supply heat transfer gas to the zone can be coupled to a common gas supply manifold, while gas ports 26 corresponding to a specific zone 30 that are configured to remove heat transfer gas from the zone can be coupled to a common exhaust manifold. Additionally, the grouping of gas ports 26 can be further delineated by surface features (not shown), such as ridges, in the table 20.

A zone can be activated to supply heat transfer gas to the zone while a previously activated zone is de-activated to remove heat transfer gas from the zone. Activation or deactivation of zones can be implemented in a dynamic, controlled manner. Each control valve 32 through which heat transfer gas is supplied to the backside of the substrate includes or is used in conjunction with a pressure regulator to set the gas pressure at the specific zone. For example, the gas pressure delivered to each zone can range from several Torr to approximately 100 Torr. Additionally, for example, the gas pressure delivered to each zone can range from 10 Torr to approximately 50 Torr. For example, during activation of a zone, the gas pressure can be increased to 50 Torr, while during deactivation, the gas pressure can be decreased to approximately 10 to 30 Torr or less.

The supply and removal of heat transfer gas can be initiated and then disrupted, causing the local temperature at positions with the disrupted backside gas flow to increase while causing the local temperature at positions with the initiated backside gas flow to decrease. The timing or sequencing of these changes in flow by zones can produce a dynamic pressure distribution or pressure wave on the backside of the substrate that, in turn, can affect a dynamic temperature distribution or thermal wave that propagates radially, or circumferentially or otherwise, across the substrate. The term "pressure wave" is used herein to refer to a spatially varying pressure imposed on the backside of the substrate, and is not meant to be confused with an acoustic pressure wave in the conventional sense which is a longitudinal wave that depends upon inter-molecular collisions within a continuous gaseous atmosphere. The timing or sequencing of the supply and removal of heat transfer gas can, for example, be performed to create a pressure wave of substantially constant phase speed. Alternatively, the timing or sequencing of the supply and removal of heat transfer gas can be performed to create a pressure wave of spatially and/or temporally variable phase speed. Alternate methods can use combinations of systematic zones or random zones across the substrate. Moreover, multiple zones can be changed at the same time.

The control valves 32 for each zone can be separately controllable by a controller 35. For example, the controller 35 can control the valves 32 in a sequence from one edge of the table 20 to the opposite edge so as to create a thermal wave across the substrate, such as in the direction of the arrow 36 in FIG. 1. Alternatively, the controller 35 can control the valves 32 in sequence in a circumferential direction about the center of the table 20 so as to create a circumferentially propagating thermal wave that propagates about the center of the substrate, such as in the direction of the arrow 38 in FIG. 2. Alternatively yet, the controller 35 can control the valves 32 in sequence in a radial direction towards or away from the center of the table 20 so as to create a radially propagating thermal wave that propagates radially inward towards the center or radially outward from the center of the substrate, such as in the direction of the arrows 39 in FIG. 2. Other patterns can alternatively be employed.

Figure 4A:
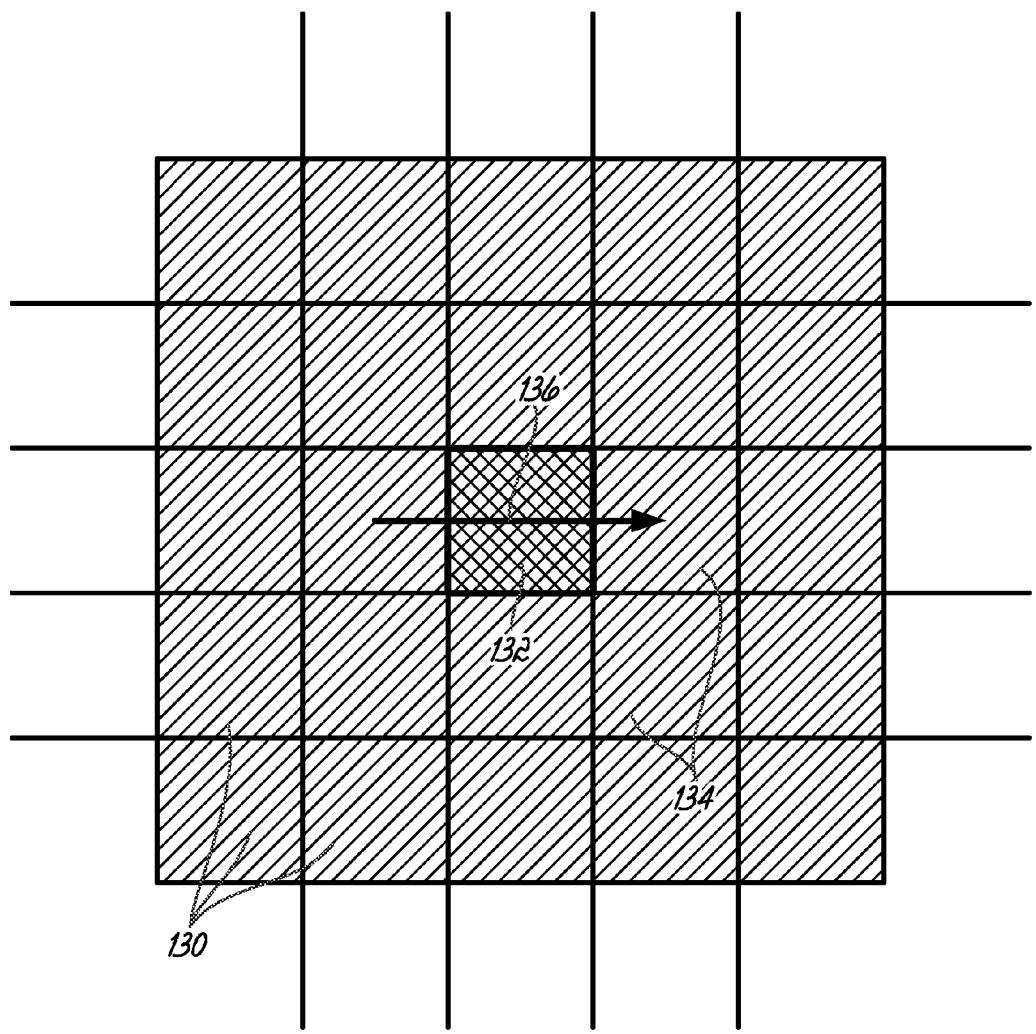
FIGS. 4A through 4C illustrate a method of dynamically altering the pressure on the backside of the substrate at one or more zones.
Figure 4B:
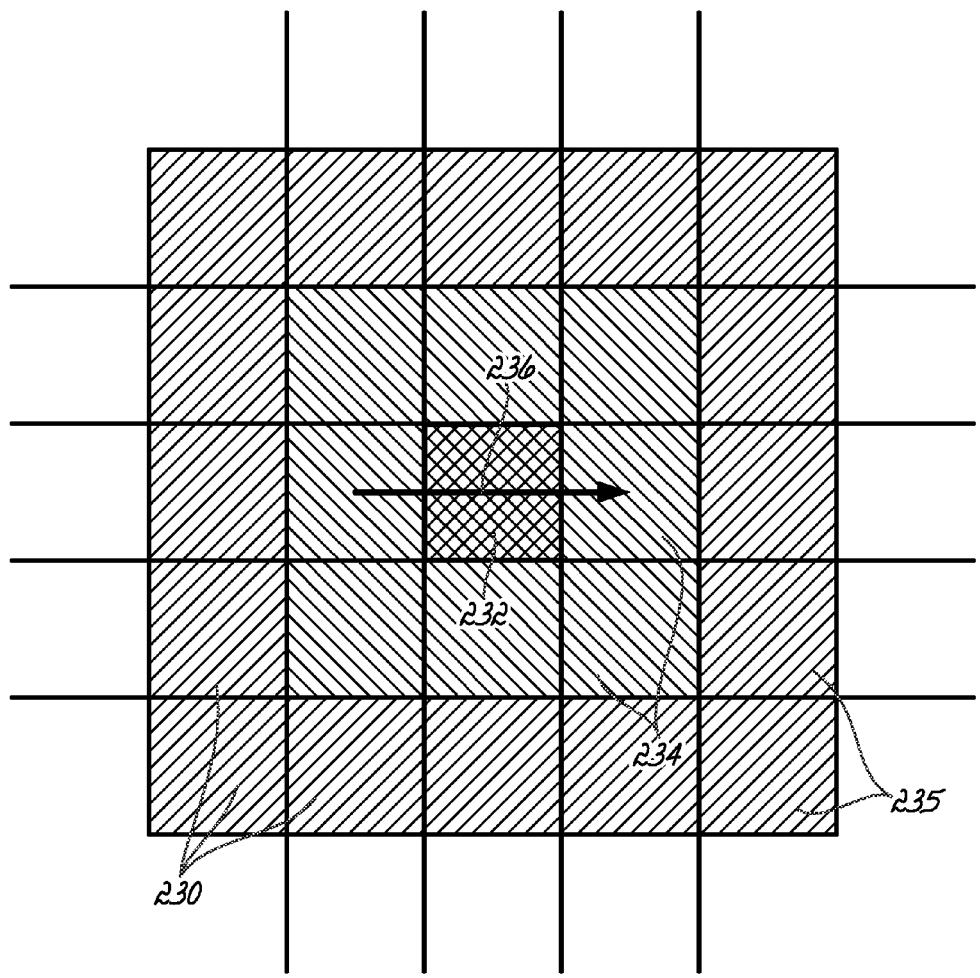
Figure 4C:
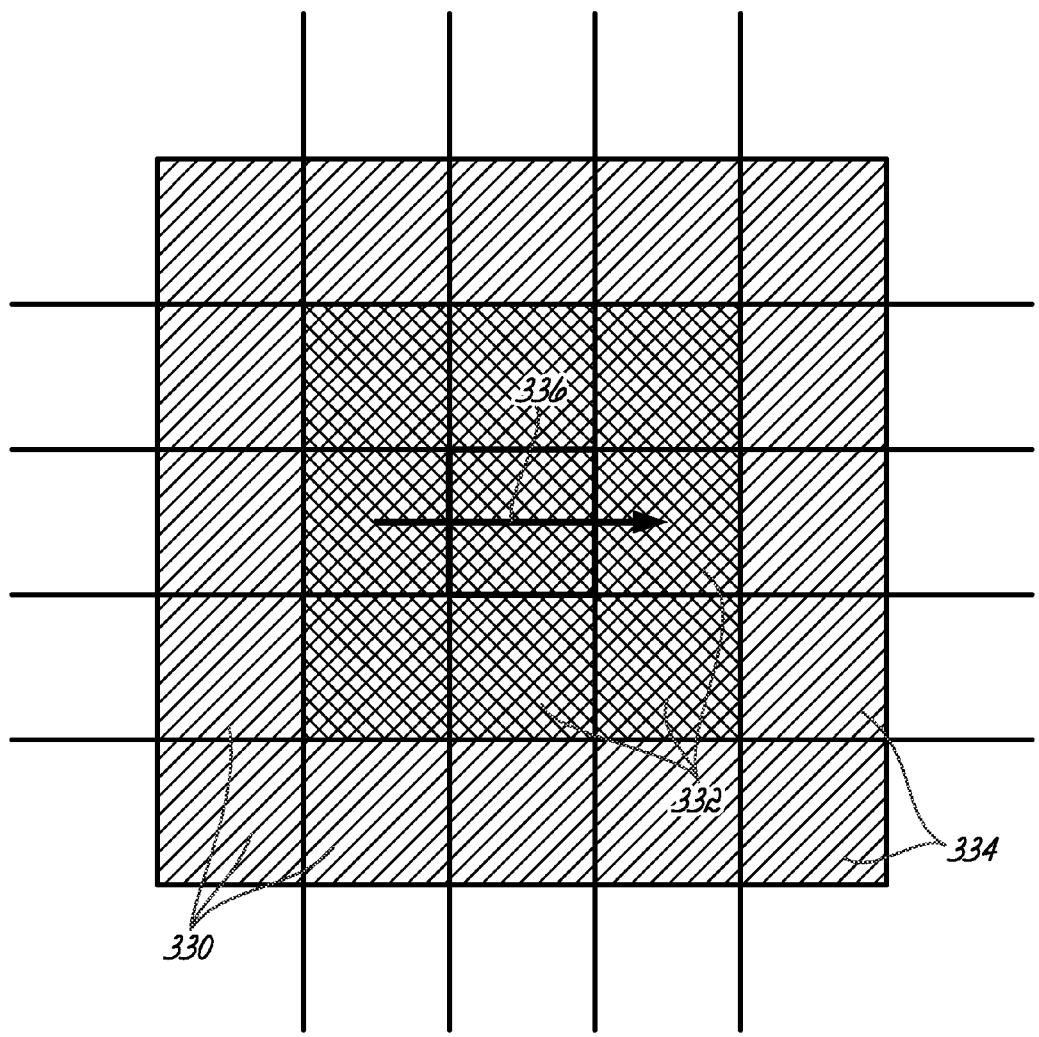

Referring now to FIGS. 4A through 4C, several examples are further provided to illustrate dynamic adjustment of the backside pressure. As shown in FIG. 4A, a plurality of zones 130 are provided in a grid-like arrangement. One zone 132 is activated for a first duration of time, while surrounding zones 134 are de-activated. The de-activation of surrounding zones 134 may include operating these zones at a reduced pressure (relative to zone 132), or it may include evacuating these zones. Following the first duration of time, the activated zone 132 may be de-activated, and the adjacent zone may then be activated as illustrated in the direction of operation 136 in FIG. 4A.

As shown in FIG. 4B, a plurality of zones 230 are provided in a grid-like arrangement. One zone 232 is activated for a first duration of time, while surrounding zones 235 are de-activated. The de-activation of surrounding zones 235 may include operating these zones at a reduced pressure (relative to zone 232), or it may include evacuating these zones. Moreover, intermediate zones 234 may be activated at an intermediate pressure, e.g., a value between the activated zone 232 and the surrounding zones 235. Following the first duration of time, the activated zone 232 may be de-activated, and the adjacent zone may then be activated as illustrated in the direction of operation 236 in FIG. 4B.

As shown in FIG. 4C, a plurality of zones 330 are provided in a grid-like arrangement. Several zones 332 are activated for a first duration of time, while surrounding zones 334 are de-activated. The de-activation of surrounding zones 334 may include operating these zones at a reduced pressure (relative to the activated zones 332), or it may include evacuating these zones. Following the first duration of time, the activated zones 332 may be de-activated, and the adjacent zones may then be activated as illustrated in the direction of operation 336 in FIG. 4C.

Figure 5A:
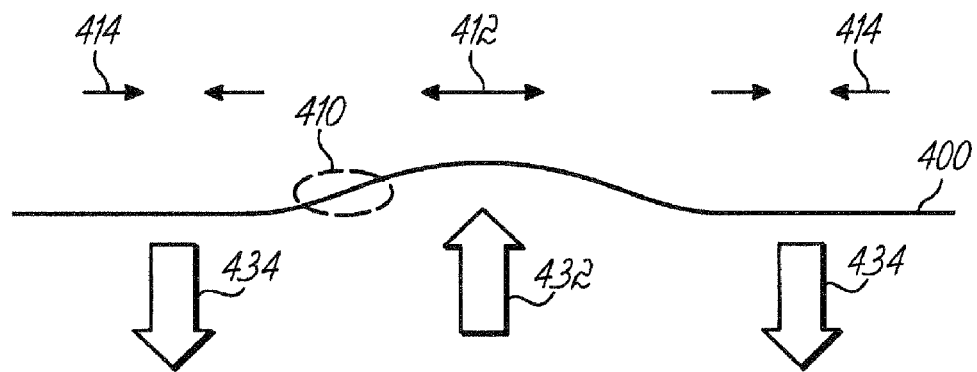
FIGS. 5A and 5B illustrate an effect of local deformation of a substrate according to different embodiments.
Figure 5B:
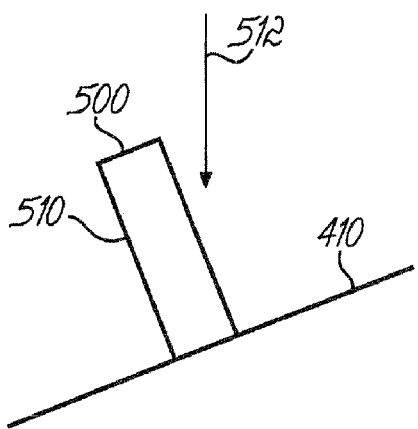

Referring now to FIGS. 5A and 5B, several additional examples are further provided to illustrate dynamic adjustment of the backside pressure in order to cause local deformation of the substrate. As shown in FIG. 5A, a substrate 400 is locally deformed at site 410 where the backside pressure is activated at zone 432, while the backside pressure is de-activated or evacuated at surrounding zones 434. According to one example, the deformation of substrate 400 at site 410 causes tensile stresses 412 in substrate 400 at site 410, while it causes compressive stresses 414 in substrate 400 surrounding site 410. For instance, dynamic stressing, including both tensile and compressive stresses, and de-stressing the substrate may affect relaxation of crystal interfaces or induce more crystal boundaries, and may even reduce crystal defects. According to another example, as illustrated in FIG. 5B, the tilting of substrate 400 at site 410 can affect more direct treatment of side-walls 510 of feature 500 by an impinging treating agent 512. For instance, the treating agent 512 can include material for deposition on side-wall 510, or it may include ions from an etching plasma, cleaning plasma, or treating plasma.

The local pressure can be in excess of 50 Torr, or desirably, it may in excess of 100 Torr. Alternatively, the local pressure may be in excess of 500 Torr.

Table 20 can further comprise a temperature monitoring system (not shown) and one or more temperature measuring devices. Controller 35 can be coupled to the temperature monitoring system and can be configured to perform at least one of adjusting, controlling, or monitoring the temperature of the substrate, or the table 20, or both, at one or more locations.

The temperature measuring device can include an optical fiber thermometer, an optical pyrometer, a band-edge temperature measurement system as described in pending U.S. patent application Ser. No. 10/168,544, filed on Jul. 2, 2002, the contents of which are incorporated herein by reference in their entirety, or a thermocouple such as a K-type thermocouple. Examples of optical thermometers include: an optical fiber thermometer commercially available from Advanced Energies, Inc., Model No. OR2000F; an optical fiber thermometer commercially available from Luxtron Corporation, Model No. M600; or an optical fiber thermometer commercially available from Takaoka Electric Mfg., Model No. FT-1420.

A spatial map of temperature, for example, or a spatial map of a process result, including for example a critical dimension, profile, side-wall angle (SWA), etch rate, deposition rate, film thickness, etc., may be utilized to dictate the control scheme for adjusting the supply of heat transfer gas to different thermal zones on the backside of the substrate. For example, if a spatial map of the etch rate of a substrate, or a spatial map of the pattern CD of a substrate following lithography, is acquired and a relationship between the etch rate (or CD) and substrate temperature is understood (e.g., etch rate increases with higher temperature), then at least one of the gas pressure for a particular thermal zone or the time that a specific thermal zone is activated (supplied with heat transfer gas at a specific pressure) or de-activated (supplied with heat transfer gas at a reduced pressure and/or evacuated) can be adjusted accordingly. For instance, thermal zones requiring a lower etch rate (to correct for the acquired non-uniform spatial map of the etch rate) may be operated at higher backside pressure and/or longer time durations, whereas thermal zones requiring a greater etch rate may be operated at lower backside pressure and/or shorter time durations.

Controller 35 may typically include a microprocessor, a memory, and a digital input/output (I/O) port, potentially including digital/analog (D/A) and/or A/D converters, capable of generating control voltages sufficient to communicate and activate inputs to table 20 as well as monitor outputs from table 20. As shown in FIG. 3, controller 35 can be coupled to and exchange information with control valves 32, the gas supply system 28, the pumping system 29, the clamping system (not shown), the table temperature control system (not shown), and the temperature monitoring system (not shown). A program stored in the memory interacts with the components of the thermal treatment assembly according to a stored process recipe.

The controller 35 may also be implemented as a general purpose computer, processor, digital signal processor, etc., which causes a thermal treatment assembly to perform a portion or all of the processing steps of the invention in response to the controller 35 executing one or more sequences of one or more instructions contained in a computer readable medium. The computer readable medium or memory is configured to hold instructions programmed according to the teachings of the invention and can contain data structures, tables, records, or other data described herein. One example of controller 35 may be a general purpose computer such as a DELL PRECISION WORKSTATION 640™, available from Dell Corporation, Austin, Tex. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read.

Controller 35 may be locally located relative to the table 20, or it may be remotely located relative to the table 20, connected thereto via an internet or intranet. Thus, controller 35 can exchange data with the table 20 using at least one of a direct connection, an intranet, or the internet. Controller 35 may be coupled to an intranet at a customer site (i.e., a device maker, etc.), or coupled to an intranet at a vendor site (i.e., an equipment manufacturer). Furthermore, another computer (i.e., controller, server, etc.) can access controller 35 to exchange data via at least one of a direct connection, an intranet, or the internet.

Figure 2:
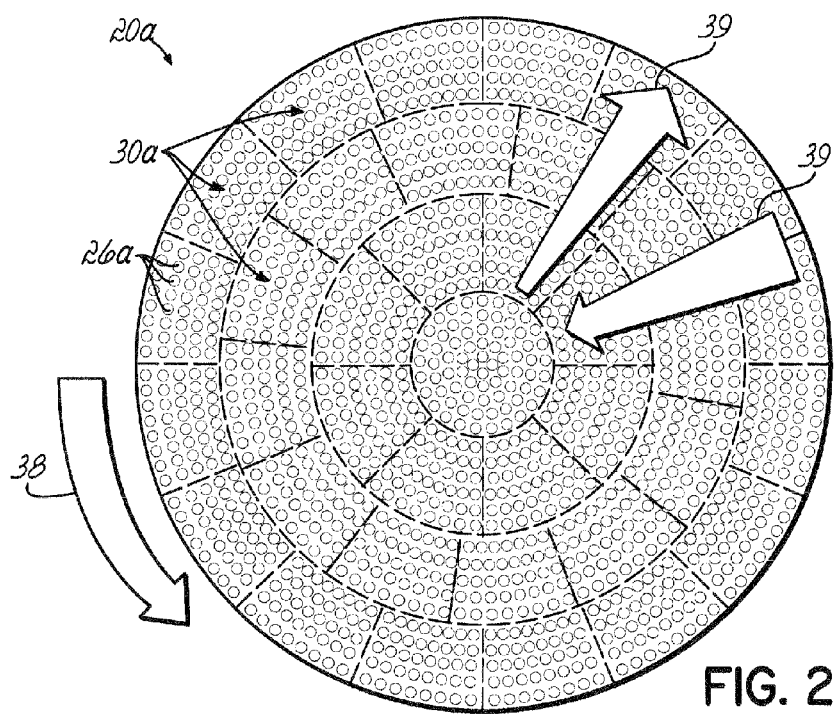
FIG. 2 is a diagram similar of an upper surface of a substrate supporting chuck sub-divided into an alternative pattern according to another embodiment of the invention.

FIG. 2 illustrates an alternative support table 20a having a concentric annular array of zones 30a, and concentric rings of gas ports 26a, grouped to a valve that controls flow to or from the ports 26a within each zone 30a, which can be operated in a manner similar to the zones 30 in FIG. 1. Various zone patterns can be used. The embodiment of FIG. 1 can more easily produce the pattern represented by the arrow 36, while that of FIG. 2 can more easily produce the patterns represented by the arrow 38 and arrows 39, although either can be controlled to approximate each or another pattern.

The support tables 20 or 20a are typically situated in an upwardly facing orientation at the bottom of a vacuum chamber 40, as shown in FIG. 3, to support a substrate facing a plasma source 42 located above the substrate in an upper portion of the chamber 40. In this case, the plasma source 42 is a coil or antenna coupled to an RF generator 44 that produces an inductively coupled plasma in the chamber 40. Alternatively, the plasma source 42 comprises an electrode that produces a capacitively coupled plasma.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

Accordingly, what is claimed is:

1. A method of locally deforming a substrate, comprising:
supporting a substrate on a substrate support in a vacuum chamber for processing;
providing backside gas through inlet ports of each of a plurality of groups of ports, each group lying in a different one of a respective plurality of areas across the substrate support, to a space between the substrate support and the substrate, each of said areas of the substrate support having at least one backside gas inlet port connected to a supply of backside gas and at least one outlet port connected to a vacuum exhaust system;
separately controlling the pressure of the backside gas at different ones of the areas of the plurality to control separately the local pressure on the backside of the substrate overlying different ones of said areas on the substrate support, by separately dynamically controlling at least one valve affecting gas how to at least one of said areas while separately dynamically controlling at least one other valve affecting gas flow from the remaining plurality of ports of each of said areas surrounding said port to which gas is introduced.

2. The method of claim 1 wherein:
the supporting of the substrate on the substrate support includes holding the substrate to the support with electrostatic force.

3. The method of claim 1 wherein:
the providing of the backside gas includes injecting the gas through a plurality of ports of each of a plurality of groups of ports lying in a respective plurality of areas across the substrate support.

4. The method of claim 3 further comprising:
separately controlling backside gas flow through the ports in the respective areas according to a sequence that dynamically affects the local pressure force exerted on the backside of the substrate.

5. The method of claim 1, further comprising:
depositing a film on a feature on said substrate.

6. The method of claim 1, further comprising:
etching a film on a feature on said substrate.

7. The method of claim 1, further comprising:
treating the side-wall of a film on a feature on said substrate.

8. The method of claim 1 wherein:
each of said areas of the substrate support has at least two of said ports, including at least one backside gas inlet port connected to a supply of backside gas and at least one outlet port connected to a vacuum exhaust system.

9. The method of claim 1, wherein the local pressure exerted on the backside of the substrate at one of said areas is in excess of 50 Torr.

10. The method of claim 1, wherein the local pressure exerted on the backside of the substrate at one of said areas is in excess of 100 Torr.

11. The method of claim 1, wherein the local pressure exerted on the backside of the substrate at one of said areas is in excess of 500 Torr.

12. The method of claim 1, wherein the local pressure exerted on the backside of the substrate at one of said areas causes the deformation of said substrate.

13. The method of claim 1, wherein the local pressure exerted on the backside of the substrate at one of said areas causes the formation of tensile stresses and compressive stresses in said substrate.

14. A method of locally deforming a substrate, comprising:
predetermining a deformation profile for a substrate to attain during processing, by which profile the substrate is to deform differently at different points across the substrate;
supporting a substrate on a substrate support in a vacuum chamber hr processing,
providing backside gas through inlet ports of each of a plurality of groups of ports, one group of ports lying in each of a respective plurality of areas across the substrate support to a space between the substrate support and the substrate, each of said areas of the substrate support having at least one backside gas inlet port of a group connected to a supply of backside gas and at least one outlet port of the group connected to a vacuum exhaust system; and
deforming the substrate differently adjacent different areas across the substrate support by separately and differently controlling the pressure of the backside gas at different ones of the areas of the plurality to control separately and differently, the local force exerted on the backside of the substrate at different areas, to achieve the predetermined deformation profile of the substrate.

15. The method of claim 14 further comprising:
predetermining a pressure profile to produce the predetermined deformation profile; and
separately controlling the pressure of the backside gas in accordance with the predetermined pressure profile.

16. The method of claim 14 further comprising:
sensing the deformation of the substrate during processing; and
separately controlling the pressure of the backside gas at different areas differently in response to the sensed deformation of the substrate.

17. The method of claim 14 wherein:
the controlling of the pressure includes separately dynamically controlling at least one valve of each of a plurality of valves, each connected to at least one port of each of the groups of ports, and thereby differently affecting gas flow to a port of each of said areas.

18. The method of claim 17 further comprising:
separately dynamically controlling at least one valve connected to a port of each of a plurality of the groups to dynamically affect gas flow at each of a plurality of said areas across the wafer.

19. A method of locally deforming a substrate, comprising:
supporting a substrate on a substrate support in a vacuum chamber for processing wherein the substrate support has a support surface for supporting a substrate thereon for processing, the substrate support surface having a plurality of ports therethrough communicating with a space between the support surface and the backside of a substrate supported thereon;
providing backside gas to the space between the substrate support and the substrate through a plurality of ports, at least one of which lies in each of a plurality of areas across the substrate support, each of said areas having at least one of said ports therein; and
separately controlling a plurality of valves, connected to different ones of said ports at different ones of said areas, in a sequence so as to vary the backside gas pressure dynamically from one area to another so as to dynamically vary the backside gas pressure across the backside of the substrate and create a moving pressure wave across the backside of the substrate that dynamically changes deformation of the substrate.

20. The method of claim 19 further comprising:
predetermining a dynamic deformation profile that moves either linearly, radially or circumferentially across the substrate; and
separately controlling the plurality of valves in a sequence in accordance with the predetermined pressure profile.

* * * * *

UNITED STATES PATENT AND TRADEMARK OFFICE
CERTIFICATE OF CORRECTION

| | | |
|---|---|---|
| PATENT NO. | : 7,576,018 B2 | Page 1 of 1 |
| APPLICATION NO. | : 11/684957 | |
| DATED | : August 18, 2009 | |
| INVENTOR(S) | : Merritt Funk | |

It is certified that error appears in the above-identified patent and that said Letters Patent is hereby corrected as shown below:

In Claim 1, Column 8, line 25, "affecting gas how to at least" should read -- affecting gas flow to at least --.

In Claim 14, Column 9, line 14, "chamber hr processing," should read -- chamber for processing; --.

Signed and Sealed this

Twenty-third Day of March, 2010

David J. Kappos
*Director of the United States Patent and Trademark Office*